Aug. 25, 1970 W. F. DONNELL ET AL 3,525,880

STEP-GAIN SIGNAL CONDITIONING CIRCUIT

Filed Oct. 3, 1966 2 Sheets-Sheet 1

INVENTORS
WILLIAM F. DONNELL
HERMAN E. SHEFFIELD, JR.
BY Russell E. Schlorff

STEP-GAIN SIGNAL CONDITIONING CIRCUIT

Filed Oct. 3, 1966 2 Sheets-Sheet 2

INVENTORS
WILLIAM F. DONNELL
HERMAN E. SHEFFIELD, JR.
BY
Russell E. Schlorff

United States Patent Office 3,525,880

Patented Aug. 25, 1970

3,525,880

STEP-GAIN SIGNAL CONDITIONING CIRCUIT

William F. Donnell and Herman E. Sheffield, Jr., Houston, Tex., assignors to Dresser Industries, Inc., Dallas, Tex., a corporation of Delaware Filed Oct. 3, 1966, Ser. No. 583,800
Int. Cl. H03k 5/08
U.S. Cl. 307—237 1 Claim

ABSTRACT OF THE DISCLOSURE

A field effect transistor is connected between a point intermediate an input terminal and an output terminal, and a common or grounded point. Another transistor is periodically driven to saturation to cause the field effect transistor to become fully conductive, after which the other transistor is released from saturation and a capacitor begins to charge, thus raising the voltage on the gate of the field effect transistor to which it is connected. At a certain point of the capacitor charge cycle, the field effect transistor begins to be "pinched-off," thus causing its impedance to vary as does the charging of the capacitor.

Figure 1:
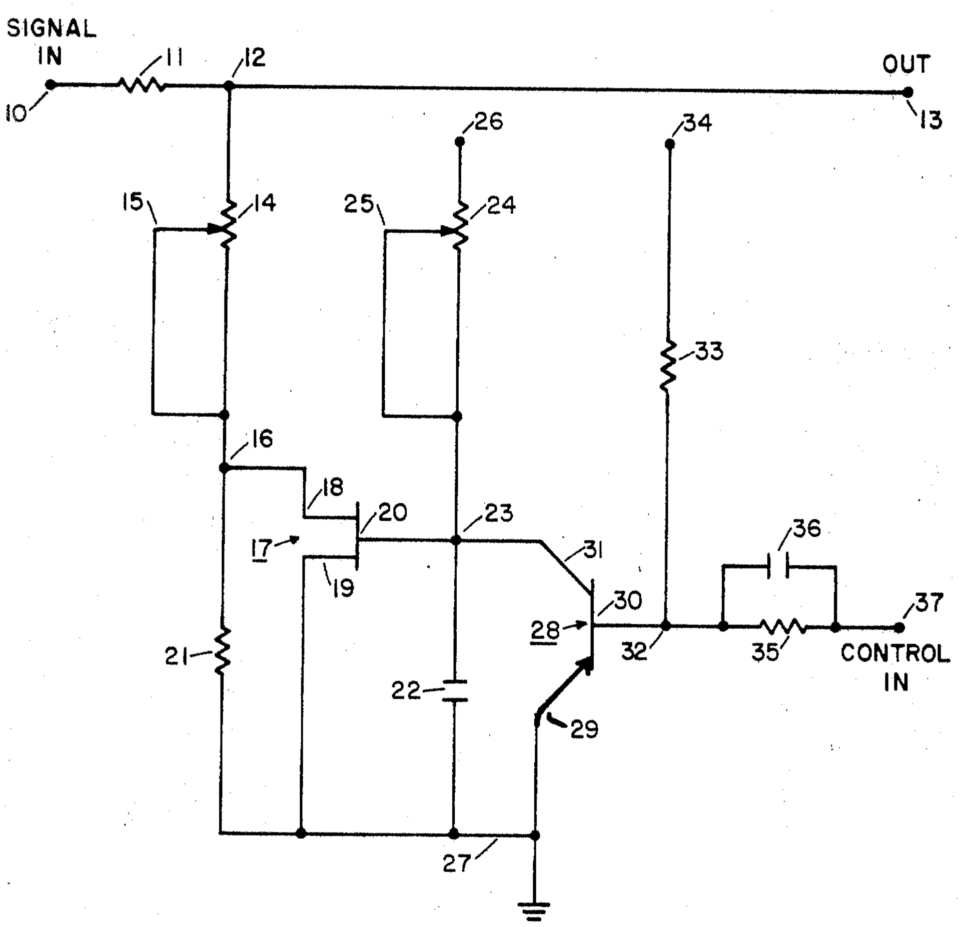

This invention relates to a circuit for conditioning a signal voltage wave form. More particularly, the invention relates to a circuit which allows a less distorted analog-presentation of data which has been recorded by a method wherein the pre-recording signal gain is increased in steps to compensate for a reduced signal level, such as in the recording of signals which have a decreasing amplitude as a function of time.

In the digital recording of seismic signals, the signals are oftentimes amplified by a circuit or circuit device which is capable of providing changes in gain over a wide gain range, for example, as a factor of two. The gain is then changed in steps during the arrival of the seismic signal. As the arriving seismic signal decreaes in amplitude the output of the amplifier, which is then recorded digitally, is thus always at a high level. The amplifier gain increases as the input signal level decreases, thus resulting in discrete jumps in signal level which are a function of the change in gain. The amplifier gain is also recorded digitally.

When the digital data is converted again to analog form, the jumps or increases in signal level present difficulties in presentation with conventional equipment.

It is therefore a primary object of this invention to provide a circuit which will allow a les distorted analog signal which substantially removes the steps in signal level.

It is another object of the invention to provide a circuit which smoothes a signal having a changing slope in amplitude.

It is another object of the invention to provide a circuit which allows the undistorted analog presentation of data which has been recorded by a method wherein the pre-recording signal gain has been increased in steps to compensate for a reduced signal level.

The objects of the invention are accomplished, broadly, by a circuit which works in conjunction with a control voltage signal, wherein that signal is used to drive a transistor into saturation, thus effectively discharging a charged capacitor to ground. At the termination of the control signal, the capacitor is allowed to charge back up to some predetermined value which then controls the gate of a field-effect transistor, thus varying the gain of the circuit to compensate for a changing signal level.

These and other objects, advantages and features of the present invention will be apparent from the following detailed description where reference is made to the figures in the accompanying drawings.

Figure 2:
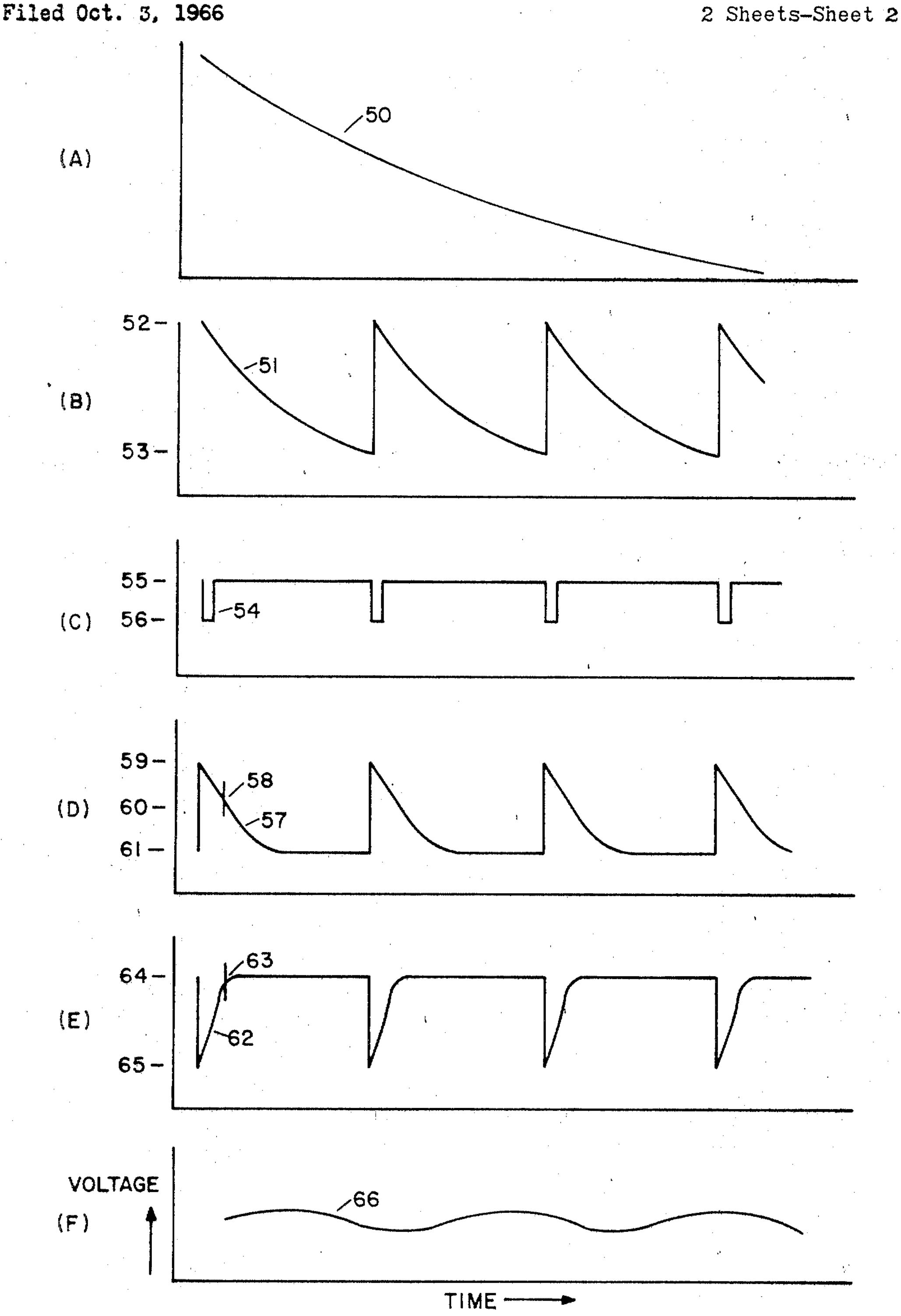

In the drawings:

FIG. 1 is a schematic illustration of the circuit according to the invention; and FIG. 2(*a–f*) illustrates some representative wave forms which are present at different points in a circuit according to the invention.

Referring first to FIG. 1, the circuit according to the invention is described and illustrated wherein a signal input terminal 10 is connected through resistor 11 to terminal 12 which in turn is connected to terminal 13, the output terminal. Terminal 12 is also connected through the potentiometer 14 to terminal 16, terminal 16 also being connected to the sliding arm 15 of the potentiometer 14. Terminal 16 is connected through resistor 21 to the line 27 which is grounded. Terminal 16 is also connected to the drain terminal of field-effect transistor 17, said transistor also having a grounded source 19 and a gate 20 which is connected to the terminal 23. Terminal 23 is connected through capacitor 22 to the grounded line 27. Terminal 23 is also connected through the potentiometer 24 to terminal 26, terminal 26 having a negative 12 volts applied thereto, although not illustrated as such. The sliding arm 25 of potentiometer 24 is also connected to terminal 23. Terminal 23 is also connected to the collector 31 of transistor 28, said transistor having a grounded emitter 29 and a base 30. The base 30 is also connected to terminal 32, said terminal 32 being connected through resistor 33 to terminal 34, said terminal 34 having applied thereto a positive 6 volt power supply, although not illustrated. Terminal 32 is connected through the parallel combination of resistor 35 and capacitor 36 to the control in terminal 37.

The component values which find utility in FIG. 1 are listed in the following table:

TABLE

Resistors:
- 11—200K ohms
- 14—1K potentiometer
- 21—1.2K
- 24—1M potentiometer
- 33—39K
- 35—6.2K Capacitors:
- 22—.2 μf.
- 36—200 pf.

Transistors:
- 17—2N3824
- 28—2N1305

In the operation of the circuit according to the invention, an input signal, such as is illustrated in FIG. 2(*b*) and indentified therein as wave form 51, is applied to the terminal 10. The wave form 51 is derived from the declining amplitude wave form 50 of FIG. 2(*a*) by conventional circuit techniques well-known in the seismic data art. The wave form 51 typically periodically goes from some level 52 to a level 53, which as discussed hereinbefore, is somewhat difficult to use when the digital data is again converted to analog form. As illustrated in FIG. 2(*c*) a series of negative going pulses 54 are applied to the control in terminal 37, the control pulses 54 having an approximate duration of 15 microseconds and going from zero volts to approximately −6 volts. After the control signal passes through the combination of resistor 35 and capacitor 36, the pulse drives the transistor 28 into saturation, thus effectively discharging capacitor 22 to almost ground potential, since the voltage drop across transistor 28 in a saturated state is negligible. After the control pulse, being only 15 microseconds in duration, is no longer applied to transistor 28, the capacitor 22 charges towards −12 volts as is found on terminal 26, the charging rate being dependent upon the RC combination of capacitor 22 and the resistance of potentiometer 24 as determined by the sliding arm 25. The voltage as seen at terminal 23 and thus at gate 20 is illustrated in FIG. 2(*d*) as going from approximately zero volts at point 59 to −12 volts at point 61. As the voltage reaches approximately a negative 7 volts at a point 60 on the vertical scale and at a point 58 on the wave from 57, the voltage at gate 20 is at the pinch-off voltage of the field-effect transistor 17. The source-drain resistance of the field-effect transistor is thus made to go from its minimum, when the gate potential is nearly grounded, to a very high value, when the gate voltage is more negative than the pinch-off voltage. Thus it should be appreciated that as the wave 57 becomes more negative, that is, goes between points 60 and 61, the field-effect transistor 17 is pinched off and the impedance of field-effect transistor 17 between the source 18 and drain 19 is very high, oftentimes on the order of several megohms.

Since the gain of the circuit is dependent upon the path from terminal 12, through potentiometer 14, and through the field-effect transistor 17 to the grounded line 27, the circuit gain is thus seen to be at a higher level when the input signal is lowest and vice versa. The circuit gain is illustrated in FIG. 2(*e*) wherein the wave form 62, being representative of the circuit gain, goes from a point 64 to a point 65, thus representing a reduction in gain of the circuit whenever the signal input is higher.

FIG. 2(*f*) represents a somewhat smoothed voltage output wave form 66 which appears at output terminal 13 during the operation of the circuit of FIG. 1. This type of signal level variation can then be further smoothed by conventional automatic gain control circuitry if desired.

While the invention has been described in the preferred embodiment with respect to an incoming signal with steps representing a factor-of-two, other step changes are within the scope of the invention and can be accommodated by varying the ratio of resistors 14 and 21. Whatever the step-change being used, for example, a factor-of-two, the resistance from terminal 12 to ground, including any loading of the output, should be decreased by exactly ½ (in the case of the factor-of-two) when the field-effect transistor is turned on. This change can be effected by the adjustment of potentiometer 14.

It should be approciated that the switching means, for example, transistor 28, can be a second field-effect transistor.

Thus there has been described a circuit for smoothing or conditioning a signal having a periodic change in amplitude. While such a circuit finds immediate utility in the seismic data art, it will likewise find a utility in signal conditioning circuitry in other electronic arts.

While particular embodiments of the present invention have been shown and described, it is apparent that changes and modifications may be made without departing from this invention in its broader aspects and, therefore, the aim in the appended claim is to cover all such changes and modifications as fall within the true spirit and scope of the invention.

What we claim is:

1. A circuit for conditioning a signal voltage of varying amplitude, comprising:

(a) a signal input terminal for applying said signal voltage to said circuit;

(b) an output terminal;

(c) variable impedance means comprising a field-effect transistor having a gate region, a source region and a drain region, said variable impedance means being at least partially determinative of the gain of said circuit connected between said input and output terminals;

(d) second means for controlling said variable impedance means for causing said variable impedance means to vary in a predetermined time relationship with said signal voltage, said second means comprising:

a control input terminal;

switching means comprising a second transistor connected to said control input terminal, whereby a control voltage can be applied to said control input terminal in a predetermined time relationship with said signal voltage to thereby cause said switching means to switch;

a voltage source; and a capacitor connected to said second transistor, to the gate of said field-effect transistor and to said voltage source, whereby said capacitor stores said voltage source and discharges said stored voltage when said second transistor switches, thereby causing the voltage on said gate to vary in a timed relationship with said control voltage, thus causing the source-drain impedance of said field-effect transistor to vary inversely as does the amplitude of said signal voltage;

(e) a junction between said input and output terminals;

(f) a first resistor connected to said junction; and (g) a second resistor connected in series with said first resistor and in parallel with the source-drain path of said field-effect transistor, whereby the gain of said circuit is at least partially determined by the amount of shunting of said second resistor by said field-effect transistor.

References Cited

UNITED STATES PATENTS

| | | | |
|---|---|---|---|
| 2,873,387 | 2/1959 | Kidd | 307—237 |
| 3,159,751 | 12/1964 | Bogdan | 307—237 |
| 3,268,658 | 8/1966 | Schroeder | 307—237 |
| 3,221,186 | 11/1965 | MacDonald | 307—237 |
| 3,246,080 | 4/1966 | Ritchey | 307—237 |
| 3,263,175 | 7/1966 | Stahl | 307—237 |
| 3,349,386 | 10/1967 | Zug | 307—237 |

JOHN S. HEYMAN, Primary Examiner

H. A. DIXON, Assistant Examiner